(12) United States Patent
Arnold et al.

(10) Patent No.: US 7,074,275 B2
(45) Date of Patent: Jul. 11, 2006

(54) APPARATUS FOR TREATING WORKPIECES

(75) Inventors: Gregor Arnold, Bodenheim (DE); Andreas Lüttringhaus-Henkel, Darmstadt (DE); Jürgen Klein, Mainz (DE); Stephan Behle, Hahnheim (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 10/892,530

(22) Filed: Jul. 15, 2004

(65) Prior Publication Data

US 2005/0051088 A1 Mar. 10, 2005

(30) Foreign Application Priority Data

Jul. 15, 2003 (DE) .............................. 103 31 946

(51) Int. Cl.
*B05B 13/06* (2006.01)

(52) U.S. Cl. ...................................... 118/318; 118/55

(58) Field of Classification Search ................ 118/317, 118/306, 318, 55, DIG. 10, 723 R, 319–321, 118/52; 219/121.47, 121.48, 121.37, 121.38; 285/226

See application file for complete search history.

(56) References Cited

U.S. PATENT DOCUMENTS

| | | | | |
|---|---|---|---|---|
| 3,321,043 A | * | 5/1967 | Vaughn | 184/109 |
| 4,201,341 A | * | 5/1980 | Huhne et al. | 239/79 |
| 4,912,296 A | * | 3/1990 | Schlienger | 219/121.59 |
| 5,451,740 A | * | 9/1995 | Hanus et al. | 219/121.59 |
| 5,750,822 A | * | 5/1998 | Gotovchikov et al. | 588/11 |
| 5,763,004 A | * | 6/1998 | Hammen | 427/231 |
| 6,215,090 B1 | * | 4/2001 | Severance et al. | 219/121.48 |
| 2003/0116964 A1 | * | 6/2003 | Springmann et al. | 285/226 |

FOREIGN PATENT DOCUMENTS

| | | |
|---|---|---|
| DE | GM 75 27 890 | 1/1976 |
| DE | 43 07 435 A1 | 11/1993 |
| DE | 42 40 991 A1 | 6/1994 |
| WO | WO 00/58631 | 10/2000 |

\* cited by examiner

*Primary Examiner*—Chris Fiorilla
*Assistant Examiner*—Yewebdar Tadesse
(74) *Attorney, Agent, or Firm*—Ohlandt, Greeley, Ruggiero & Perle, L.L.P.

(57) ABSTRACT

The invention relates to an apparatus for coating hollow bodies, e.g. plastic drinks bottles. It is an object of the invention to provide an apparatus for treating workpieces which operates reliably and with low maintenance, can be flexibly adapted to the user's requirements or to the requirements of the desired process sequence, and which allows efficient evacuation. The apparatus according to the invention comprises at least one treatment device (101) for receiving at least one workpiece, a rotor on which the treatment device is arranged, a fluid rotary leadthrough for feeding at least one fluid onto the rotor and/or for discharging at least one fluid from the rotor, the fluid rotary leadthrough having a journal and a sleeve, which at least in sections are sealed off from one another, and the journal being arranged rotatably in the sleeve. The proposed radial arrangement is particularly unsusceptible to faults and entails little maintenance.

22 Claims, 5 Drawing Sheets

APPARATUS FOR TREATING WORKPIECES

BACKGROUND OF THE INVENTION

1. Field of the Invention

The invention relates to an apparatus for treating workpieces with fluids in general and for coating hollow bodies in particular.

2. Description of Related Art

Plastics, in particular transparent plastics, are becoming increasingly important, and in many fields are displacing glass as the preferred material.

One such example is drinks bottles, which a few years ago were almost exclusively made from glass but nowadays are to a large extent made from PET plastic. The reason for this is the huge weight saving.

However, plastic bottles may have a number of drawbacks with respect to glass bottles, for example the plastics used, for example PET, are not sufficiently gas-impermeable, and consequently, in particular in the case of beverages containing carbon dioxide, the shelf life is shorter than with glass bottles unless special precautions are taken.

For this reason, the plastic bottles are internally and/or externally provided with a barrier layer by means of PICVD processes, which lengthens the shelf life.

Since drinks bottles are mass-produced products, there is a huge pressure on costs, and consequently there is a perpetual demand for improvements to the coating processes and apparatus used for this purpose.

Consequently, for efficient coating of PET bottles and other workpieces made from dielectric material, preferably plastics, it is desirable to develop an apparatus which allows very short cycle times and therefore a high throughput. Throughputs which are typically required are in the region of 10,000 bottles per hour.

WO 00/58631 has disclosed a machine of this type with a conveyor carousel for the treatment of hollow bodies in which 20 identical treatment stations are arranged on the conveyor carousel.

The invention defined in the abovementioned document works on the basis that the weight and volume of the pumps prevent them from being carried along on the carousel. Consequently, the pumps are in a fixed position and a rotary connection or distributor is used to connect the pumps to the stations.

Furthermore, the 20 stations are divided into two groups, with each group being assigned to an independent, equivalent pressure source, or the groups being differentiated on the basis of the pumps to which they are connected. The rotary distributor determines the times during the rotary motion of the conveyor carousel at which a certain pump is in communication with a certain treatment station, the distributor for this purpose having a rotating ring with 20 openings and a stationary ring with in each case 3 slots for the two groups.

However, this machine has a number of serious drawbacks.

The stationary arrangement of the pumps is disadvantageous, since the distances from the stations to the pump are relatively long, and consequently the pump power is reduced.

Furthermore, dusts or flaked-off coating fragments may accumulate in the evacuation lines and the distributor, which has an adverse effect on sealing and entails high levels of maintenance outlay.

However, a particular drawback is the use of a rotatable distributor with axially arranged disks. Distributors of this type are extremely difficult to seal and are particularly susceptible to faults caused by foreign bodies. Furthermore, on account of the fixed opening arrangement, the distributor does not allow the process sequence to be varied in any way, making it an inflexible concept.

BRIEF SUMMARY OF THE INVENTION

The invention is therefore based on the object of providing an apparatus for treating workpieces which avoids or at least alleviates the drawbacks of known apparatuses.

A further object of the invention is to provide an apparatus for treating workpieces which operates reliably and with low maintenance.

Yet a further object of the invention is to provide an apparatus for treating workpieces which can be flexibly matched to the user's requirements or to the requirements of the desired process sequence.

Yet another object of the invention is to provide an apparatus for treating workpieces which allows efficient evacuation.

The object of the invention is achieved in a surprisingly simple way by the subject matter of the independent claims. Advantageous refinements of the invention are defined in the subclaims.

One embodiment of the invention provides an apparatus for treating workpieces, in particular for the plasma coating of hollow bodies under the application of fluid, which comprises at least one treatment device, preferably a plurality of treatment devices, for receiving in each case at least one workpiece. In particular, the workpieces are internally and/or externally coated by means of a PICVD (plasma impulse chemical vapor deposition) process. The treatment devices are secured to a rotor or conveyor carousel and, in operation, rotate about the rotor axis, with one treatment cycle preferably being correlated to one rotor rotation of 360°.

Furthermore the apparatus comprises a fluid rotary leadthrough for feeding at least one fluid onto the rotor and/or for discharging at least one fluid from the rotor. It is preferable for the treatment devices to be evacuated gradually in a plurality of stages by means of vacuum pumps, with in particular at least some of the vacuum pumps being arranged in a stationary position, i.e. outside the rotor. Therefore, by way of example, vacuum passages or lines are routed onto the rotor, which is effected by means of the fluid rotary leadthrough.

On the other side, the treatment devices are supplied with fluids or process gases, in order, for example, to carry out a plasma coating of the workpieces, in particular plastic drinks bottles. These fluids are also preferably routed onto the rotor via the fluid rotary leadthrough, for example from a stationary fluid supply device. In particular, the journal and the sleeve have one or more fluid passages, through which the fluid(s) is/are fed to the treatment device on the rotor and/or discharged from the treatment device on the rotor. Accordingly, the fluid rotary leadthrough preferably defines one or more fluid passages via which the fluid(s) is/are passed from connections at the sleeve to associated connections at the journal and/or vice versa.

The fluid rotary leadthrough according to the invention has a preferably substantially cylindrical journal or shaft pin and a preferably substantially hollow-cylindrical sleeve or annular sleeve. The journal is arranged rotatably in the sleeve and, at least in sections on its lateral surface, is sealed off with respect to the sleeve.

Furthermore, the journal is preferably arranged concentrically in the sleeve, and the fluid rotary leadthrough extends along the rotor axis.

The radial or concentric design of the fluid rotary leadthrough in accordance with the invention has a number of advantages.

The fluid rotary leadthrough is of simple and reliable design. Furthermore, it is possible to use inexpensive standard seals. Furthermore, a continuous fluid connection over the entire rotary angle of 360° between the stationary part and the rotating part is possible.

Furthermore, the fluid rotary leadthrough according to the invention is suitable for a plurality of fluids to be passed through, since the diameter is, within certain limits, independent of the number of fluid passages which are implemented. Furthermore, the fluid rotary leadthrough is distinguished by a compact structure and can therefore be arranged in a readily accessible manner. This reduces the outlay involved in changing the seals. The improved accessibility also makes it easier to locate and eliminate leaks.

Therefore, the invention provides a rotary apparatus with a continuously rotating rotor and radially arranged identical coating stations with a high performance for the industrial coating process.

The fluid rotary leadthrough is particularly preferably fitted to the apparatus in such a manner that the sleeve is secured to the rotor in a rotationally fixed position and rotates with the rotor and the journal is in a fixed position. In this case, it is particularly simple to match the arrangement of the connections to the coating apparatus. However, the reverse design, with a journal which rotates in operation and a sleeve which is stationary, is also possible.

It preferable for the journal to have a substantially L-shaped or U-shaped passage with at least one axial and at least one radial passage section for each fluid, in which case the radial passage section opens out in the lateral surface of the journal in order to produce a connection to passage sections in the sleeve.

Furthermore, the sleeve and/or the journal preferably have at least one annular passage, which surrounds the journal, the annular passage being connected at least from time to time, and preferably continuously, to the radial passage section of the journal, the axial passage section, the radial passage section and the annular passage together forming a fluid passage in the fluid rotary leadthrough or being part of such a fluid passage.

On both sides of the annular passage, the journal and the sleeve are sealed, preferably by means of in each case one radially arranged seal, in particular a ring seal, i.e. the seals prevent fluid from flowing in or out in the axial direction between the journal and the sleeve. The ring seals are, for example, realized as metal or rubber seals and are preferably lubricated with a sealant, e.g. an oil suitable for vacuum applications.

This forms the basis of a further advantage of the fluid rotary leadthrough according to the invention, since it is possible in a simple way to provide sealant lines, via which, even when the apparatus is operating, it is possible to effect a possibly continuous or long-term supply of sealant or to provide lubrication for the seals. Consequently, the fluid rotary leadthrough has a longer service life and requires less maintenance.

According to a particular refinement of the invention, the sleeve has a plurality of radially arranged line connections which are distributed in a star shape in an axial plane, each treatment device being assigned a dedicated line connection. As an alternative, however, it is also possible for just one line connection to be provided on the fluid rotary leadthrough on the rotor-side, and for the fluid lines to branch off between the fluid rotary leadthrough and the treatment devices, in order to distribute the fluid or vacuum to the treatment devices.

It is preferable for the fluid rotary leadthrough to have a plurality of fluid passages. This is realized, for example, by virtue of the journal having a plurality of passages with in each case one axial and one radial passage section, with the radial passage sections diverging in a star shape and opening out in the lateral surface of the journal, and the sleeve in each case having corresponding passage sections and line connections.

The axial passage sections are preferably arranged offset in the form of a ring around the axis of rotation.

In operation, it is particularly preferable for the treatment device to pass through at least one evacuation phase, in which the treatment devices are evacuated from standard pressure by a few orders of magnitude, and at least one coating phase, in which the plasma internal coating of the hollow workpieces is carried out under the activation of a process fluid or gas. In particular, the coating is carried out in through-flow mode, so that the treatment device, during the evacuation phase, is connected via a first fluid passage in the fluid rotary leadthrough to a first vacuum pump or delivery device and, during the coating phase, is connected via a second, separate fluid passage in the fluid rotary leadthrough or rotary coupling to a second vacuum pump.

For this purpose, the sleeve and/or the journal have a plurality of annular passages, which are connected to in each case one of the radial passage sections, with in each case one radial passage section and an associated annular passage lying on one plane, so as to form a pair of transition passages, and the various pairs of transition passages being axially offset with respect to one another. It is preferable for in each case at least one ring seal to be provided between the annular passages, in order to seal off the passages with respect to one another.

The annular passages are preferably designed to run all the way around, and the line connections of the journal and the sleeve are continuously connected to one another during the rotation of the rotor through 360°, which is not readily possible, for example, with a disk arrangement.

On first impressions, the continuous connection may appear disadvantageous, since the treatment devices are subject to different process phases, requiring different process parameters. However, according to a preferred refinement of the invention, the supply and/or discharge of the fluid are controlled by means of one or more valve arrangements, which are preferably arranged on the rotor. Consequently, the process control is temporally controlled by means of the valves independently of the fluid rotary leadthrough.

This results in a dual benefit: firstly, the mechanically demanding rotary leadthrough is greatly simplified, making it less susceptible to faults, and secondly the process control is made more flexible.

With regard to the valve arrangement and control, reference is made to the application entitled "Vorrichtung und Verfahren zur Behandlung von Werkstücken" [apparatus and process for treating workpieces] PCT/EP03/05473, applied for on May. 26, 2003, and to the application entitled "Mehrplatz-Beschichtungsvorrichtung und Verfahren zur Plasmabeschichtung" [multi-position coating apparatus and process for plasma coating], DE 102 53 513.2, applied for on Nov. 16, 2002, in the name of the same Applicant, which are hereby incorporated in their entirety by reference in the subject matter of the present disclosure.

It is particularly preferable for the fluid rotary leadthrough to have at least one or more gas feed passages and one or more evacuation passages, a fluid being fed via the gas feed passages to the treatment device on the rotor, and the treatment devices being evacuated by means of one or more vacuum pumps via the evacuation passage during the evacuation phase(s) and/or the coating phase(s), in which context it is preferable to provide a separate pressure regulator for each phase.

It is advantageous for both the process gas supply and the evacuation to be realized using the same fluid rotary leadthrough.

Furthermore, for functional reasons the gas feed passages and evacuation passages differ in terms of their diameter.

Therefore, the evacuation passages preferably have an internal diameter of at least 25 mm, preferably between 50 mm and 250 mm, and particularly preferably between 100 mm and 160 mm. The gas feed passages preferably have an internal diameter of from 5 mm to 50 mm, particularly preferably between 10 mm and 30 mm, in particular approximately 25 mm.

It is preferable for the treatment devices to be evacuated at least from time to time during the treatment of the workpieces, by means of vacuum pumps, the evacuation being carried out in a plurality of stages and at least one of the vacuum pumps being arranged on the rotor. In this case, in particular, in at least one evacuation passage there is a vacuum pump upstream and a vacuum pump downstream of the is fluid rotary leadthrough.

The fluid rotary leadthrough may advantageously therefore be designed for a vacuum range >1 mbar and may be designed with relatively small line cross sections. Therefore, the demands imposed with regard to the leakage rates in the pressure range >1 mbar are advantageous relatively low. The fluid rotary leadthrough therefore makes do with a leak rate of <$10^{-2}$ mbar*l/sec. It can therefore be produced at low cost.

Furthermore, the smaller cross sections mean that the fluid rotary leadthrough can also be produced with a plurality of fluid passages, i.e. 2, 3, 4, 5, 6 or more, in an economic and compact design.

The text which follows provides a more detailed explanation of the invention on the basis of exemplary embodiments and with reference to the drawings, in which identical and similar components are provided with the same reference numerals and the features of the various exemplary embodiments can be combined with one another.

DETAILED DESCRIPTION OF THE INVENTION

Figure 1:
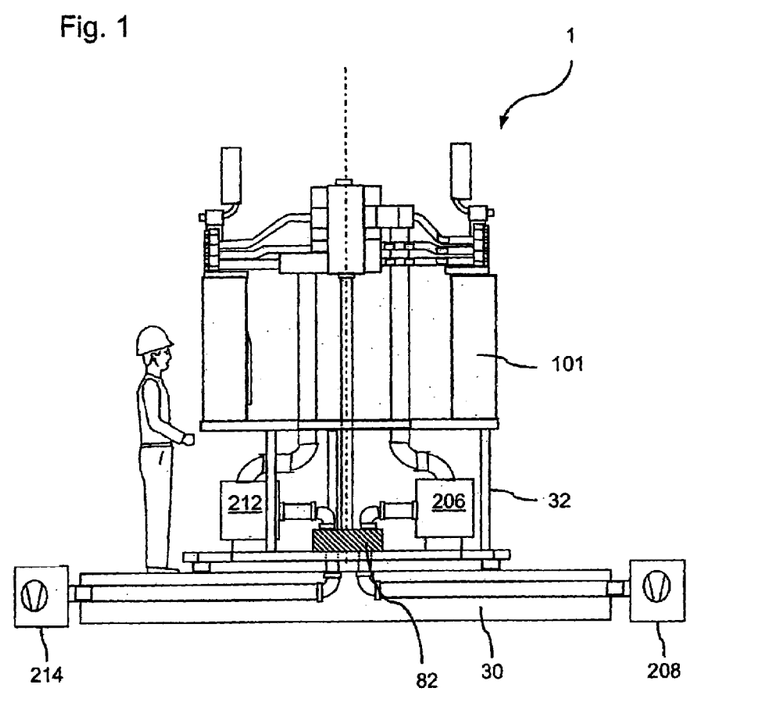
FIG. 1 shows a diagrammatic side view of a treatment apparatus.

FIG. 1 shows an apparatus 1 for the plasma coating of hollow plastic bodies which are coated in a plurality of treatment devices 101 by means of the PICVD process.

The apparatus 1 comprises a plasma wheel or a rotor 32, on which the treatment devices 101 or plasma stations are secured. The rotor 32, in operation, rotates with respect to a stationary base 30. In the center of the apparatus 1 there is a fluid rotary leadthrough or gas rotary leadthrough 82, via which an operating medium or process gas is fed to the rotating treatment devices 101 and the treatment devices 101 can be evacuated by means of pumps arranged on the rotor and in a stationary position.

Figure 2:
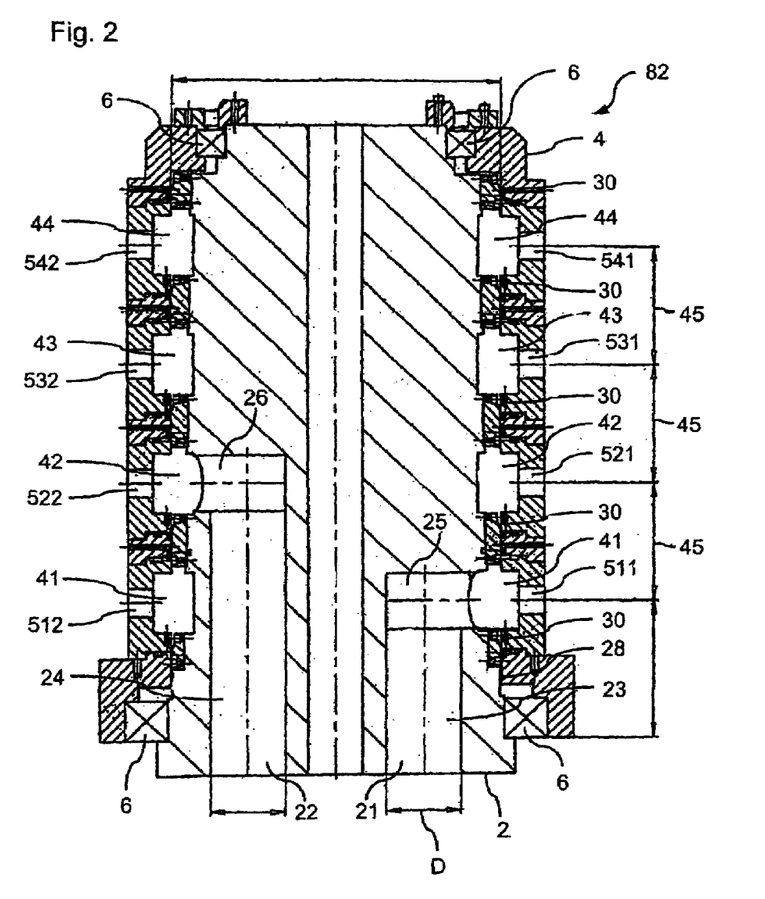
FIG. 2 shows a longitudinal section through a fluid rotary leadthrough in accordance with a first embodiment of the invention.

FIG. 2 shows a first embodiment of the fluid rotary leadthrough or rotary leadthrough 82.

The rotary leadthrough 82 comprises a journal or shaft pin 2 connected to the base 30 in a manner fixed in terms of rotation and a sleeve or annular sleeve 4 connected to the rotor 32 in a manner fixed in terms of rotation. The annular sleeve 4 is mounted rotatably on the journal 2 by means of rotary bearings 6.

The sleeve 4 has four annular passages 41, 42, 43, 44, which are arranged axially offset with respect to one another. The distance 45 between the annular passages is in the mm range. A plurality of connection bores are connected to each annular passage, with in each case one connection bore being assigned to one treatment device 101. FIG. 2 shows in each case two opposite connection bores 511, 512, 521, 522, 531, 532, 541, 542 per annular passage.

The journal 2 has two fluid or evacuation passages, 21, 22 with an internal diameter D of 102 mm. The evacuation passages 21, 22 are continuously connected to the annular passages 41 and 42, respectively, since the latter are designed to run all the way around. Consequently, the rotary supply produces a continuous connection over the entire rotary angle of 360°.

Two further evacuation passages for connection to the annual passages 43 and 44 are likewise present in the journal 2 but cannot be seen in the sectional illustration presented in FIG. 2, since in the position of the rotary leadthrough 82 which is shown these passages are positioned perpendicular to the plane of the drawing.

The evacuation passages 21, 22 each have an axial passage section 23 or 24, respectively, and a radial passage section 25 or 26, respectively, connected thereto, these radial passage sections opening out in the lateral surface 28 of the journal 2 and in the associated annular passage 41 or 42, respectively.

There is a ring seal 30 on both sides of the annular passages.

Figure 3:
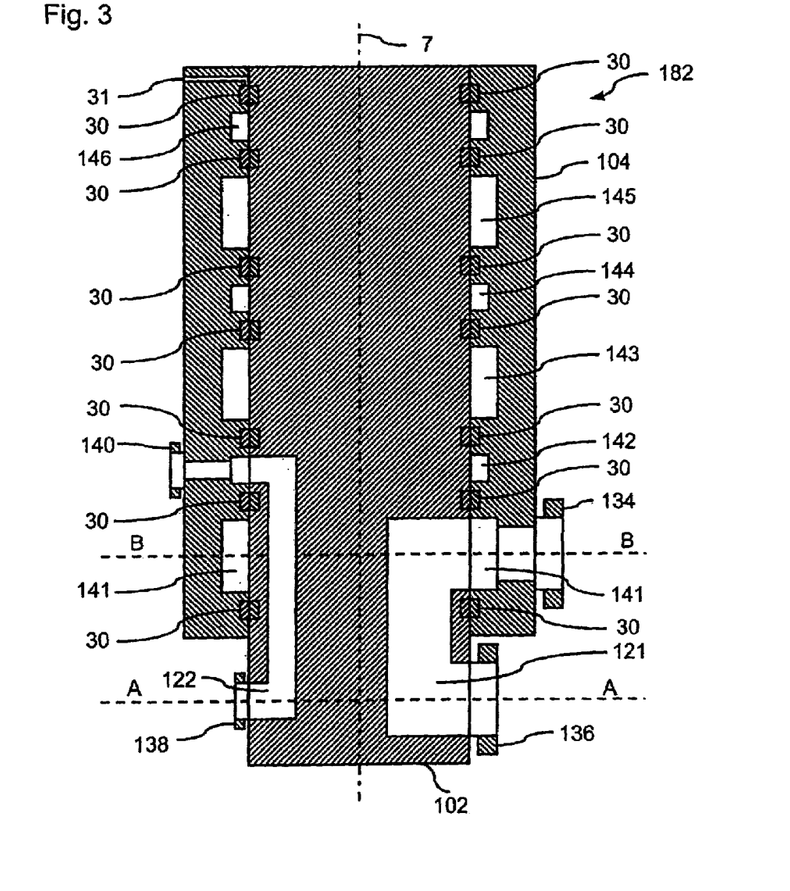
FIG. 3 shows a longitudinal section through a fluid rotary leadthrough in accordance with a second embodiment of the invention.

Reference will now be made to FIG. 3, which illustrates a further embodiment of the rotary leadthrough 182. The journal 102 has six fluid passages, of which two differently dimensioned fluid passages 121, 122 are illustrated. Each fluid passage is assigned one of six annular passages 141 to 146.

The treatment devices are evacuated via the fluid passage 121, and process gas is fed to the treatment devices via the fluid passage 122. The fluid passages are substantially U-shaped in form and each comprises an axial section which extends along the axis of rotation 7.

The treatment devices are connected via tubes, if appropriate with the addition of a vacuum pump, to a connection flange 134. Stationary pumps are connected to a lower connection flange 136 on the other side of the passage 121.

Accordingly, on the gas supply side, a gas supply device is connected to the treatment devices via a connection flange 138, the gas supply passage 122 and a connection flange 140.

All the seals 30 are continuously lubricated with vacuum oil via sealant lines. For the sake of clarity, just one sealant line 31 at the top seal is illustrated.

Figure 4:
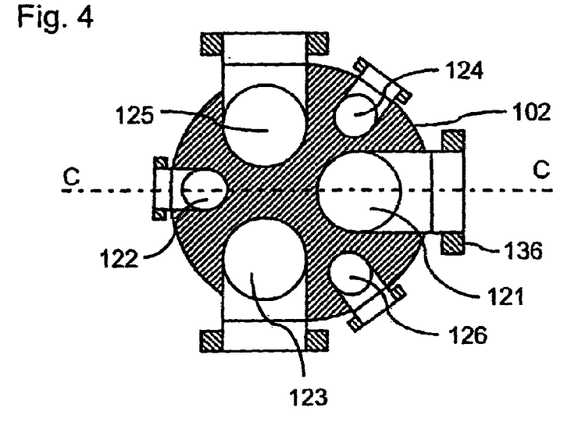
FIG. 4 shows a cross section on section line A—A in FIG. 3.

Referring now to FIG. 4, the rotary leadthrough 182 has three evacuation passages 121, 123 and 125. The evacuation passages are distributed around the axis at angular intervals of approximately 120°. Between the evacuation passages there are three gas supply passages 122, 124 and 126.

Figure 5:
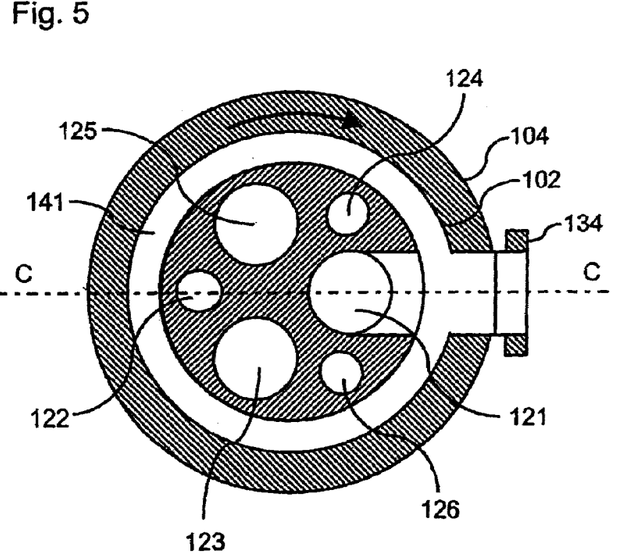
FIG. 5 shows a cross section on section line B—B in FIG. 3.

Referring now to FIG. 5, the encircling annular passage 141 is illustrated. If the sleeve 104 rotates about the journal 102, there is a permanent fluid connection between the evacuation passage 121 and the connection flange 134 via the annular passage 141.

Figure 6:
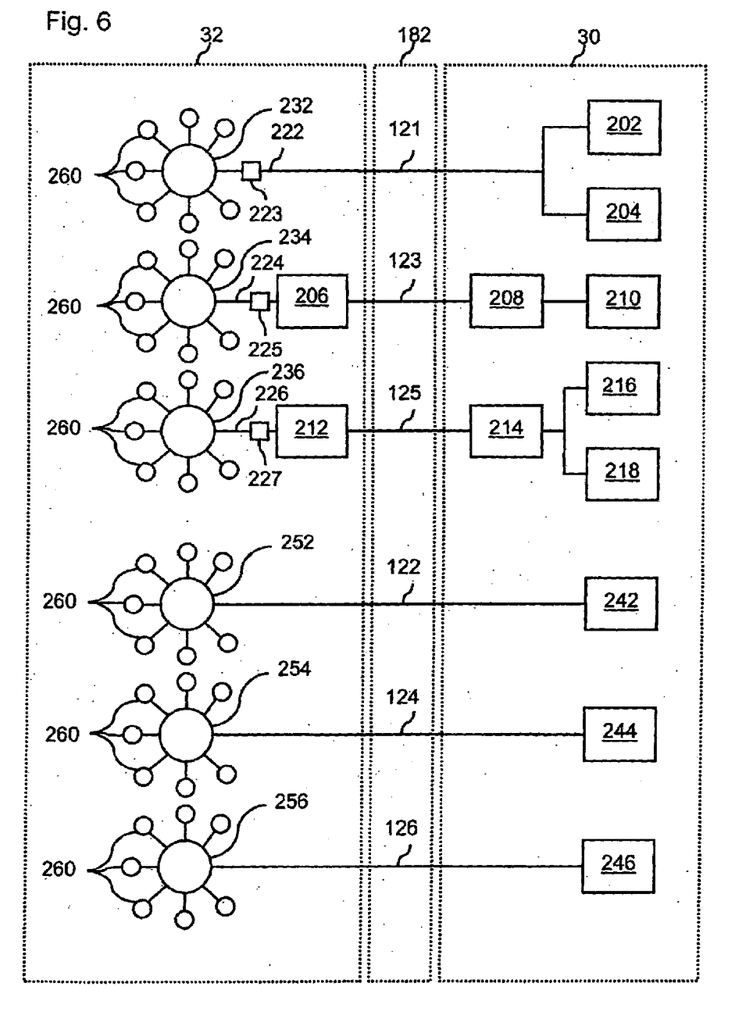
FIG. 6 shows a block diagram illustration of a vacuum pump arrangement.

Referring now to FIG. 6, a coating cycle is carried out as follows. During a first pumping phase, the treatment device is evacuated to a preliminary vacuum of between approximately 100 mbar and 1 mbar by means of a first pump arrangement comprising two rotary slide preliminary vacuum pumps 202, 204 connected in parallel. The feed lines are routed onto the rotor 32 via the evacuation passage 121 in the rotary leadthrough 182. The rotary slide pumps 202 and 204 have a pump power of in each case 1200 standard m$^3$/h.

At the required machine power, the time needed to deliver the next vessel is very short. Therefore, a second evacuation phase is provided, in order for the evacuation to be carried out in stages. During the second evacuation phase, the treatment devices are evacuated via a serial second pump arrangement, comprising a first Roots pump 206, a second Roots pump 208 and a rotary slide pump 210.

The Roots pump 206 has a pump power of 4000 standard m$^3$/h, the second Roots pump 208 has a pump power of 1000 standard m$^3$/h, and the rotary slide pump has a pump power of 100 standard m$^3$/h. During the second evacuation phase, the treatment devices are evacuated from the preliminary vacuum to a base pressure of approximately 0.05 to 0.8 mbar, which represents the pressure prior to the start of coating.

Then, during a first coating phase, the workpieces are provided with a first coating while a first process gas, which is supplied via the passage 124, is passing through.

The first coating phase is followed by a second coating phase, in which the workpieces are coated with a barrier layer while a second process gas is passing through via the passage 126.

During the first and second coating phases, the treatment devices are connected to a serial third pump arrangement, comprising a first Roots pump 212, a second Roots pump 214 and two parallel-connected rotary slide preliminary pumps 216 and 218.

The Roots pump 212 has a pump power of 5550 standard m$^3$/h, the Roots pump 214 has a pump power of 2000 standard m$^3$/h, and the rotary slide preliminary pumps 216 and 218 each have a pump power of 100 standard m$^3$/h.

It is advantageous for separate pump arrangements to be used for the evacuation and coating phases. This is advantageous on account of the fact that dust produces deposits in the lines and pumps during the coating process. In the exemplary embodiment, these deposits are restricted to the pumps 212, 214, 216 and 218, and contamination in the pump arrangements for the evacuation phases is avoided. Consequently, dust from the coating phases is also prevented from penetrating as far as the seals 30 of the evacuation passages 121 and 123. The wear on the seals there is reduced accordingly, thereby avoiding leaks.

The pumps 202, 204, 208, 210, 214, 216 and 218 are arranged in a stationary position outside the rotor, whereas the pumps 206 and 212 are arranged at the rotor and rotate therewith. Therefore, for at least one process phase (evacuation phase or coating phase), the fluid rotary leadthrough is arranged between at least two vacuum pumps connected in series.

This has the resultant advantage that the rotary leadthrough 182 only operates in a pressure range of >1 mbar, since the two Roots pumps 206 and 212 on the rotor are already responsible for preliminary compression. Consequently, sealing of the rotary leadthrough is greatly simplified. A leak rate of approximately <10$^{-2}$ mbar *l/sec is sufficient for the apparatus to operate without problems. Furthermore, line cross sections of approximately 100 mm are sufficient.

After the intended base pressure has been reached, the coating process is carried out. At least during the second coating phase, a plurality of treatment devices are simultaneously connected to the pump arrangement 212, 214, 216, 218.

After coating, the treatment devices are vented to ambient pressure, opened and the workpiece is conveyed out of the apparatus.

For details as to the control of the process phases, reference is made to the application entitled "Vorrichtung und Verfahren zur Behandlung von Werkstücken" [Apparatus and process for treating workpieces] in the name of the same Applicant, applied for on the same day.

The pressure, or more specifically the subatmospheric pressure, in the vacuum lines 222, 224 and 226 is in each case set by means of a separate pressure regulator 223, 225, 227 and is distributed to the treatment devices via in each case one annular distributor 232, 234 and 236, respectively. The temporal control is effected by means of two valve arrangements or valve blocks comprising valves 240, each treatment device being assigned a valve for each pump arrangement. This allows variable programming of the process control, matched to the coating requirements.

The supply of gas to the treatment devices is of similar construction. The process gas for the first and second coating phases is provided by a first and second fluid source 242 and 244, respectively. The process gas is delivered to the rotor via the passages 122 and 124 in the rotary leadthrough 182, and it is then available at the rotor continuously for further distribution and control. A purge gas from a source 246 is conveyed onto the rotor via the remaining passage 126 in order to purge the treatment devices.

Downstream of the rotary leadthrough 182, the process gases and the purge gas are distributed to the treatment devices by means of distributors 252, 254 and 256. The temporal control is effected by means of valves 260 which are arranged between the treatment devices and the distributors 252, 254 and 56.

It will be clear to the person skilled in the art that the embodiments described above are to be understood purely as examples, and that the invention is not restricted to these examples, but rather can be varied in numerous ways without departing from the scope and spirit of the invention.

The invention claimed is:

1. An apparatus for plasma coating of a hollow body with a fluid, comprising:

a treatment device for receiving the hollow body therein;

a rotor on which the treatment device is arranged; and a fluid rotary leadthrough for feeding the fluid onto the rotor and/or for discharging the fluid from the rotor, the fluid rotary leadthrough having a journal and a sleeve, wherein the journal and the sleeve are sealed off from one another, and wherein the journal is arranged rotatably in the sleeve.

2. The apparatus as claimed in claim 1, wherein the journal has a fluid passage through which the fluid is fed to the treatment device and/or the fluid is discharged from the treatment device.

3. The apparatus as claimed in claim 2, wherein the journal and the sleeve each have a line connection, the line connections being connected to one another via the fluid passage so that a flow of the fluid is made possible.

4. The apparatus as claimed in claim 3, wherein the journal has at least one passage with an axial passage section and a radial passage section, the radial passage section opening out in a lateral surface of the journal.

5. The apparatus as claimed in claim 4, wherein the sleeve or the journal has at least one annular passage around the journal, and wherein the axial passage section, the radial passage section and the at least one annular passage form a fluid passage.

6. The apparatus as claimed in claim 5, further comprising at least a first seal and a second seal, the first and second seal being arranged axially offset on a first side and a second side of the at least one annular passage, and wherein the first and second seals are designed as a ring seal.

7. The apparatus as claimed in claim 6, wherein the first seal and the second seal are oil lubricated seals.

8. The apparatus as claimed in claim 1, wherein the journal is substantially in the form of a cylinder and the sleeve is substantially in the form of a hollow cylinder, and wherein the journal is arranged concentrically in the sleeve so that the fluid rotary leadthrough extends along a rotor axis of the rotor.

9. The apparatus as claimed in claim 1, wherein the journal is secured to the rotor so that the journal rotates with the rotor.

10. The apparatus as claimed in claim 1, further comprising sealant lines in the fluid rotary leadthrough.

11. The apparatus as claimed in claim 1, wherein the sleeve has a plurality of radially arranged line connections distributed in a star shape, and wherein the treatment device comprises a plurality of treatment devices each being assigned a different one of the plurality of radially arranged line connections.

12. The apparatus as claimed in claim 1, further comprising a plurality of fluid passages being defined in the journal by a plurality of axial passage sections and a plurality of radial passage sections, the plurality of radial passage sections opening out in a lateral surface of the journal and the plurality of axial passage sections being offset in the manner of a ring.

13. The apparatus as claimed in claim 1, wherein the treatment device, in operation, passes through at least one evacuation phase and at least one coating phase, the treatment device, during the evacuation phase, being connected via a first fluid passage to a first vacuum pump, and during the coating phase being connected via a second fluid passage to a second vacuum pump.

14. The apparatus as claimed in claim 1, further comprising a plurality of annular passages axially offset with respect to one another.

15. The apparatus as claimed in claim 14, further comprising a ring seal between the plurality of annular passages.

16. The apparatus as claimed in claim 1, further comprising a valve arrangement for feeding the fluid onto the rotor and/or for discharging the fluid from the rotor.

17. The apparatus as claimed in claim 1, wherein the fluid rotary leadthrough has a plurality of gas feed passages and a plurality of evacuation passages.

18. An apparatus for plasma coating of a hollow body with a fluid, comprising:
a treatment device for receiving the hollow body;
a rotor on which the treatment device is arranged; and
a fluid rotary leadthrough for feeding the fluid onto the rotor and/or for discharging the fluid from the rotor, the fluid rotary leadthrough having a journal and a sleeve, wherein the journal and the sleeve are sealed off from one another, wherein the journal is arranged rotatably in the sleeve, and wherein the sleeve is secured to the rotor so that the sleeve rotates with the rotor.

19. An apparatus for plasma coating of a hollow body with a fluid, comprising:
a treatment device for receiving the hollow body;
a rotor on which the treatment device is arranged; and
a fluid rotary leadthrough for feeding the fluid onto the rotor and/or for discharging the fluid from the rotor, the fluid rotary leadthrough having a journal and a sleeve,
wherein the journal and the sleeve are sealed off from one another, wherein the journal is arranged rotatably in the sleeve,
wherein the journal has a fluid passage through which the fluid is fed to the treatment device and/or the fluid is discharged from the treatment device,
wherein the journal and the sleeve each have a line connection, the line connections being connected to one another via the fluid passage so that a flow of the fluid is made possible,
wherein the journal has at least one passage with an axial passage section and a radial passage section, the radial passage section opening out in a lateral surface of the journal,
wherein the sleeve or the journal has at least one annular passage around the journal, and wherein the axial passage section, the radial passage section and the at least one annular passage form a fluid passage, and
wherein the at least one annular passage is designed to run all the way around the journal, and wherein the line connections of the journal and the sleeve are continuously connected to one another during rotation of the rotor.

20. An apparatus for plasma coating of a hollow body with a fluid, comprising:
a treatment device for receiving the hollow body;
a rotor on which the treatment device is arranged; and
a fluid rotary leadthrough for feeding the fluid onto the rotor and/or for discharging the fluid from the rotor, the fluid rotary leadthrough having a journal and a sleeve, wherein the journal and the sleeve are sealed off from one another, wherein the journal is arranged rotatably in the sleeve, and wherein the fluid rotary leadthrough includes at least one gas feed passage and at least one evacuation passage.

21. The apparatus as claimed in claim 20, wherein the evacuation passage has an internal diameter from 25 mm to 250 mm, and the gas feed passage has an internal diameter from 5 mm to 50 mm.

22. An apparatus for plasma coating of a hollow body with a fluid, comprising:
a treatment device for receiving the hollow body;
a rotor on which the treatment device is arranged; and a fluid rotary leadthrough for feeding the fluid onto the rotor and/or for discharging the fluid from the rotor, the fluid rotary leadthrough having a journal and a sleeve, wherein the journal and the sleeve are sealed off from one another, wherein the journal is arranged rotatably in the sleeve, and wherein the treatment device is evacuated by one or more vacuum pumps, the one or more vacuum pumps being arranged on the rotor.

* * * * *